United States Patent
Uemura et al.

(10) Patent No.: US 10,383,229 B2
(45) Date of Patent: Aug. 13, 2019

(54) ELECTRONIC APPARATUS, FABRICATION METHOD THEREFOR AND ELECTRONIC PART

(71) Applicant: FUJITSU LIMITED, Kawasaki-shi, Kanagawa (JP)

(72) Inventors: Taiki Uemura, Kawasaki (JP); Taiji Sakai, Yokohama (JP); Hideki Kitada, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/916,807

(22) Filed: Mar. 9, 2018

(65) Prior Publication Data
US 2018/0279476 A1   Sep. 27, 2018

(30) Foreign Application Priority Data
Mar. 22, 2017   (JP) ................. 2017-055403

(51) Int. Cl.
*H05K 5/00*   (2006.01)
*H05K 7/00*   (2006.01)
(Continued)

(52) U.S. Cl.
CPC ............. *H05K 1/145* (2013.01); *H05K 1/115* (2013.01); *H05K 1/181* (2013.01); *H05K 3/32* (2013.01); *H05K 3/4038* (2013.01); *H01R 12/712* (2013.01); *H05K 1/14* (2013.01); *H05K 1/144* (2013.01); *H05K 3/0094* (2013.01); *H05K 3/3436* (2013.01); *H05K 2201/041* (2013.01); *H05K 2201/042* (2013.01); *H05K 2201/09636* (2013.01); *H05K 2201/10159* (2013.01);
(Continued)

(58) Field of Classification Search
CPC .... H05K 1/14; H05K 1/144; H05K 2201/041; H05K 2201/042; H05K 2201/043; H05K 2201/045; H05K 3/0094; H01R 12/727; H01R 12/712
USPC ................................. 361/784, 790, 791, 803
See application file for complete search history.

(56) References Cited

U.S. PATENT DOCUMENTS

| 7,332,800 B2* | 2/2008 | Kikuchi ............... H01L 21/563 257/686 |
| 2007/0139897 A1* | 6/2007 | RaghuRam ......... H01L 23/3672 361/720 |

(Continued)

FOREIGN PATENT DOCUMENTS

| JP | 2010-147221 A | 7/2010 |
| JP | 2013-501380 | 1/2013 |
| JP | 2016-051726 A | 4/2016 |

*Primary Examiner* — Binh B Tran
(74) *Attorney, Agent, or Firm* — Kratz, Quintos & Hanson, LLP

(57) ABSTRACT

An electronic apparatus includes a first circuit board, a stacked circuit that is provided on the first circuit board through first coupling terminals and has a structure in which arithmetic elements and memory elements are stacked through inter-element coupling terminals and to which a signal is inputted from the first circuit board, and a second circuit board that is provided on the stacked circuit through second coupling terminals and to which a result of processing is outputted from the stacked circuit, wherein a number of the first coupling terminals and a number of the second coupling terminals are smaller than that of the inter-element coupling terminals.

20 Claims, 15 Drawing Sheets

(51) Int. Cl.
*H05K 1/18* (2006.01)
*H05K 1/14* (2006.01)
*H05K 1/11* (2006.01)
*H05K 3/32* (2006.01)
*H05K 3/40* (2006.01)
*H01R 12/71* (2011.01)
*H05K 3/00* (2006.01)
*H05K 3/34* (2006.01)

(52) U.S. Cl.
CPC ............. *H05K 2201/10378* (2013.01); *H05K 2201/10515* (2013.01)

(56) References Cited

U.S. PATENT DOCUMENTS

2010/0155921 A1  6/2010  Saen
2012/0187578 A1  7/2012  Li

* cited by examiner

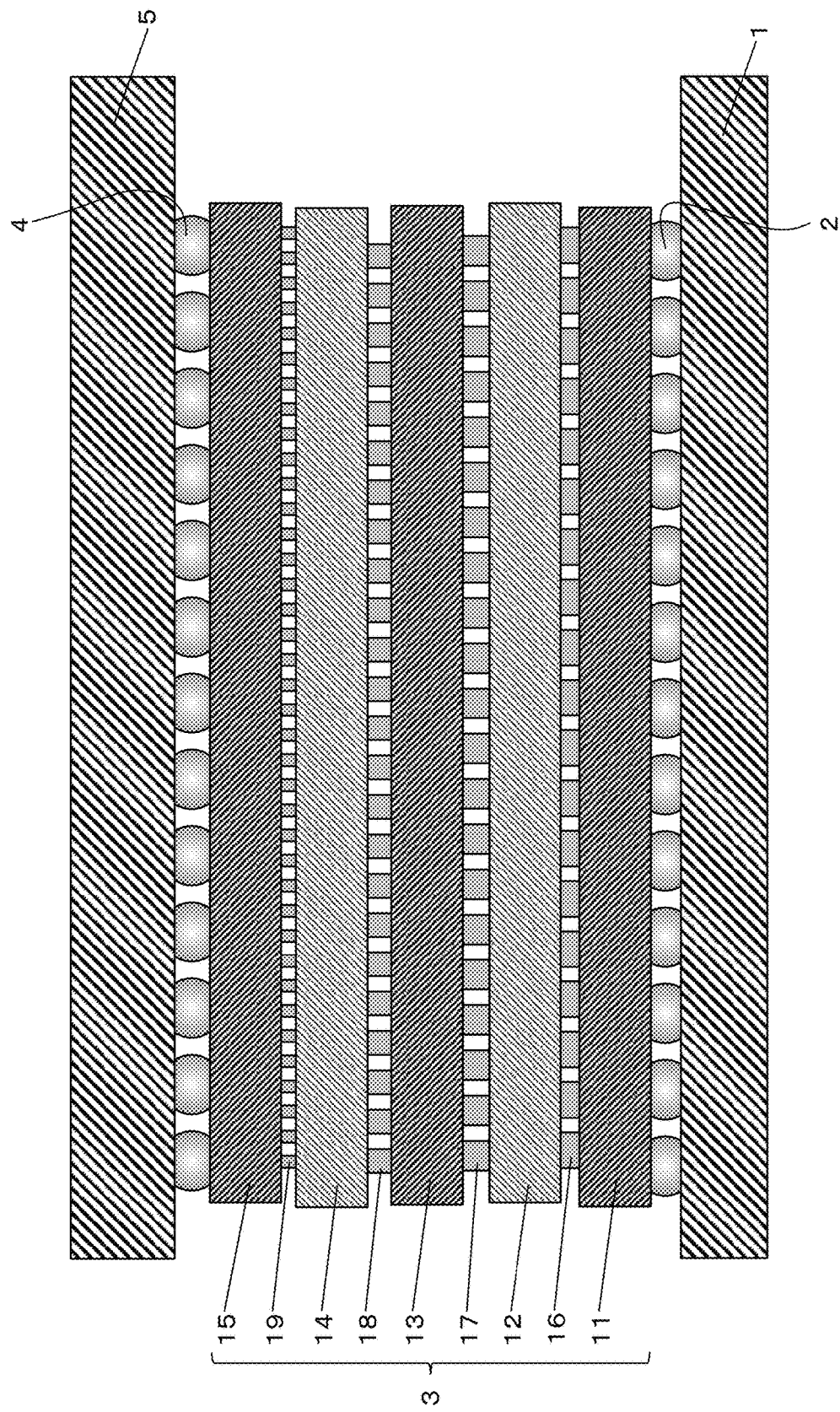

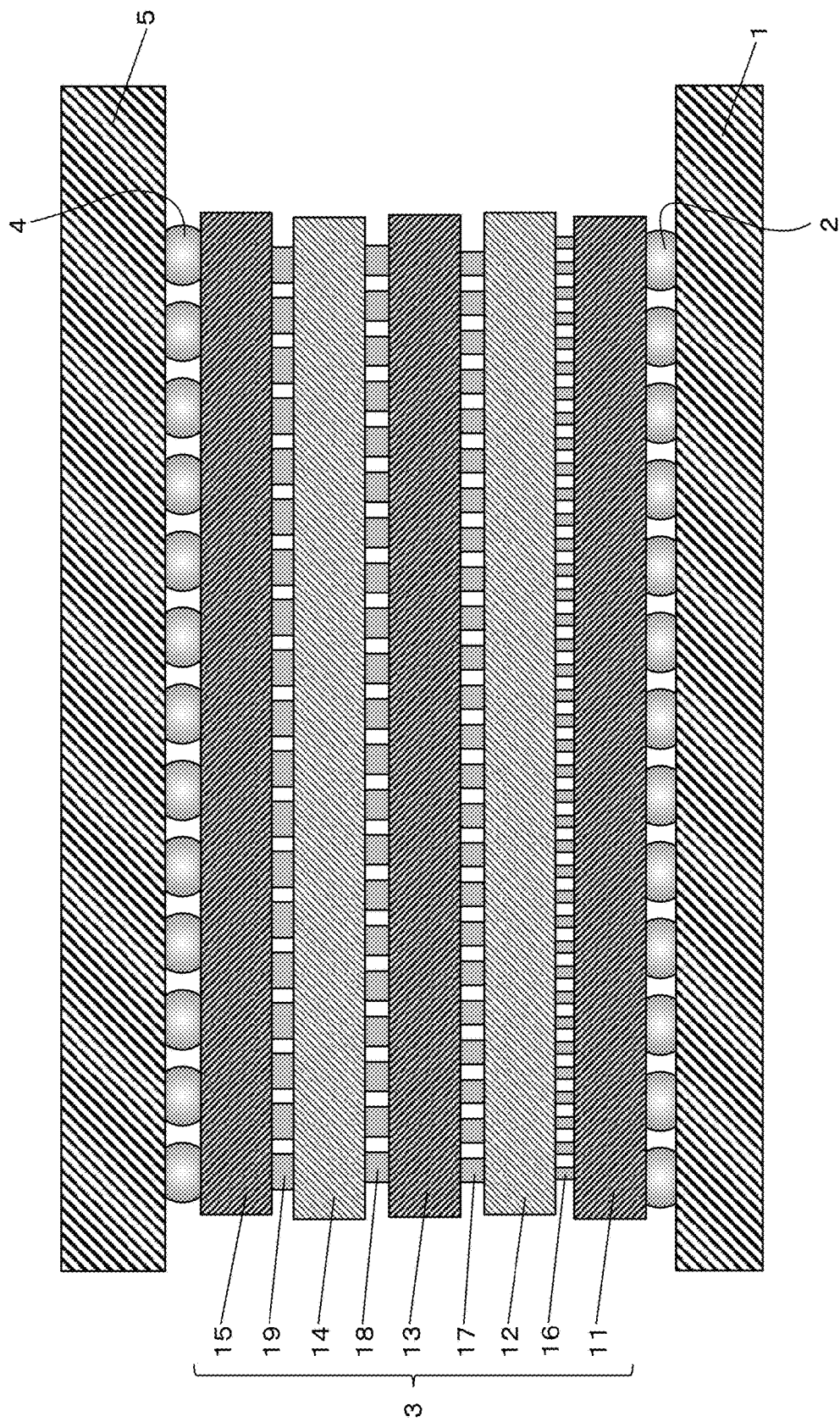

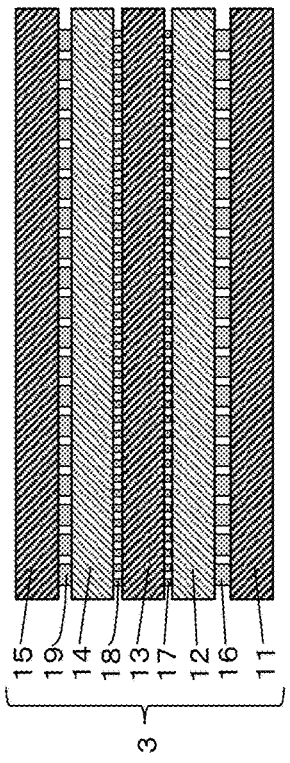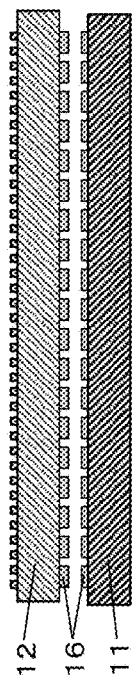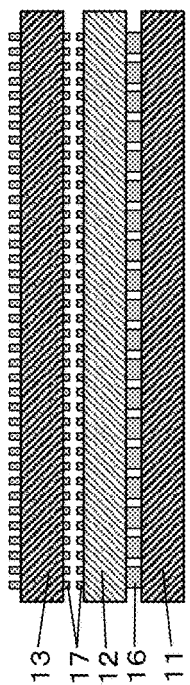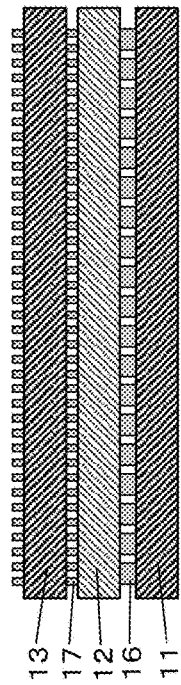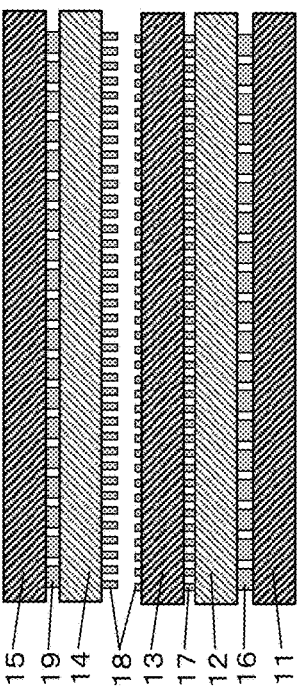

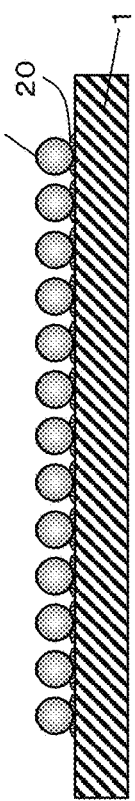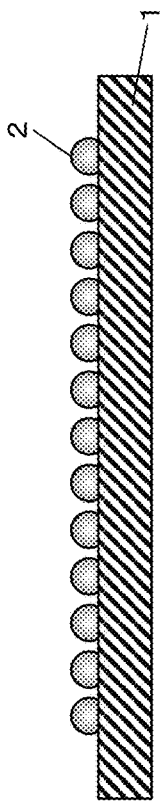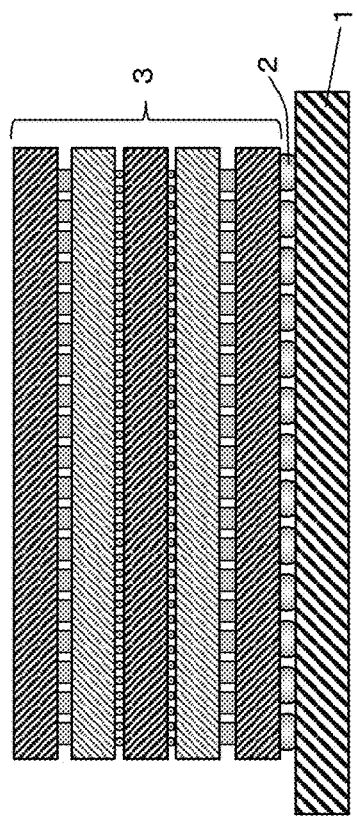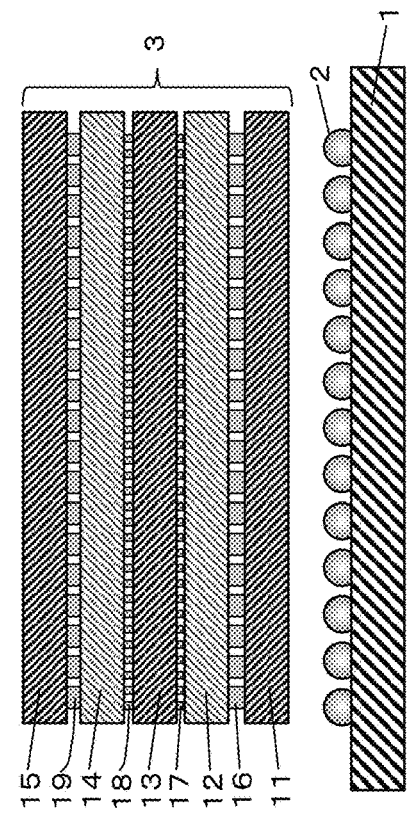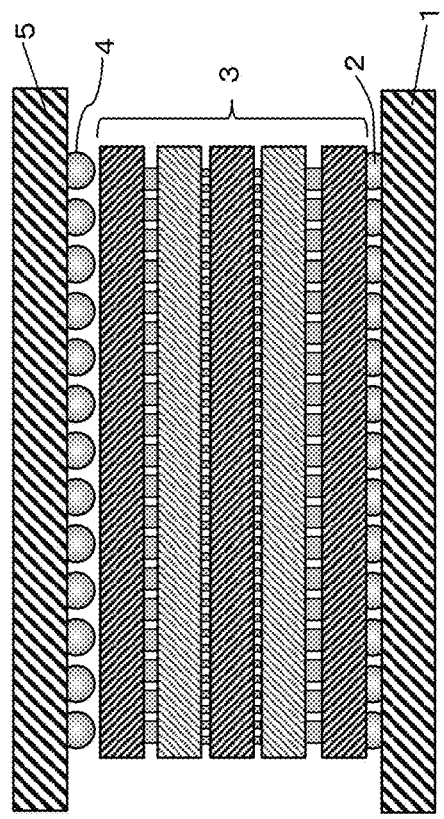

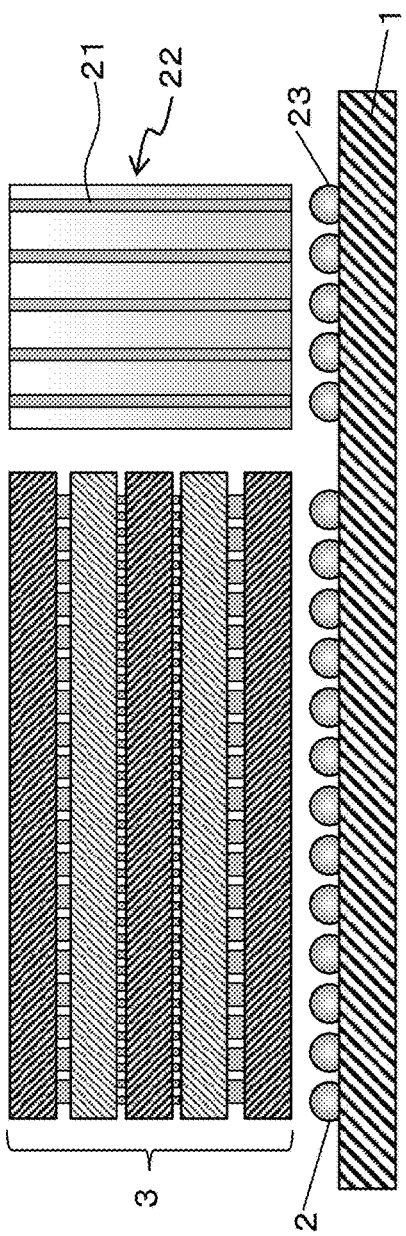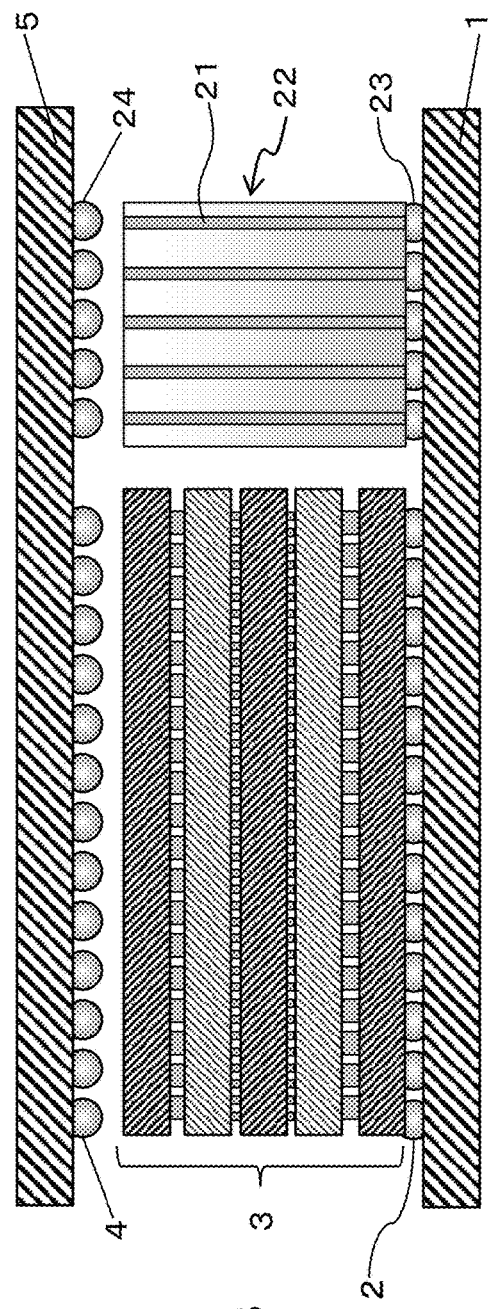

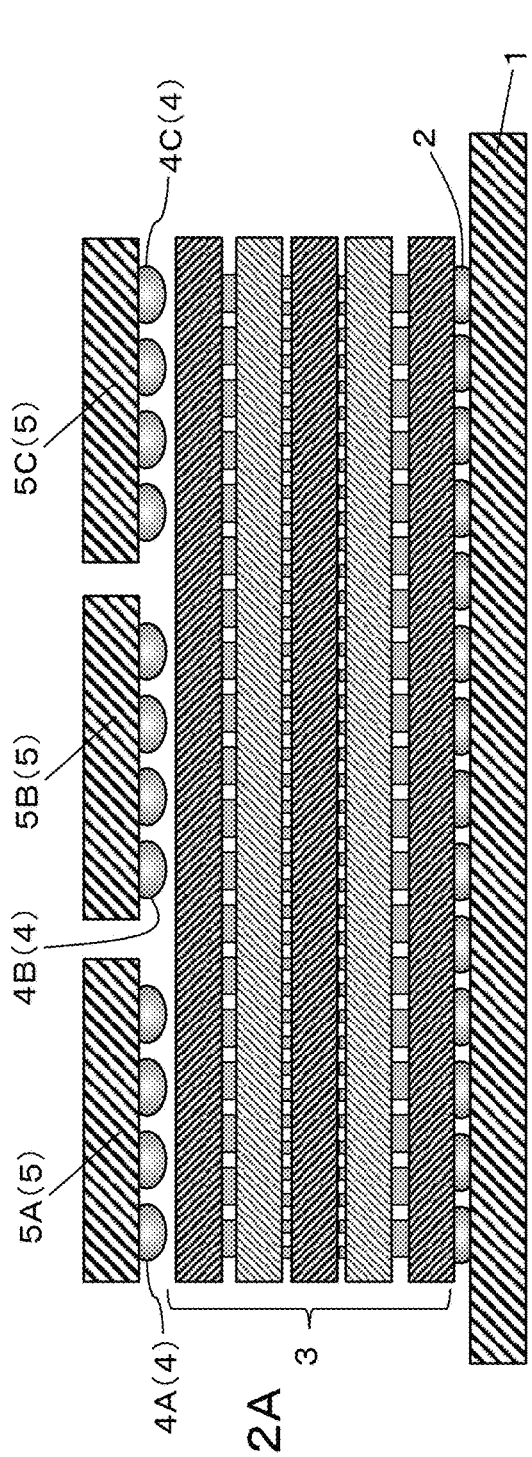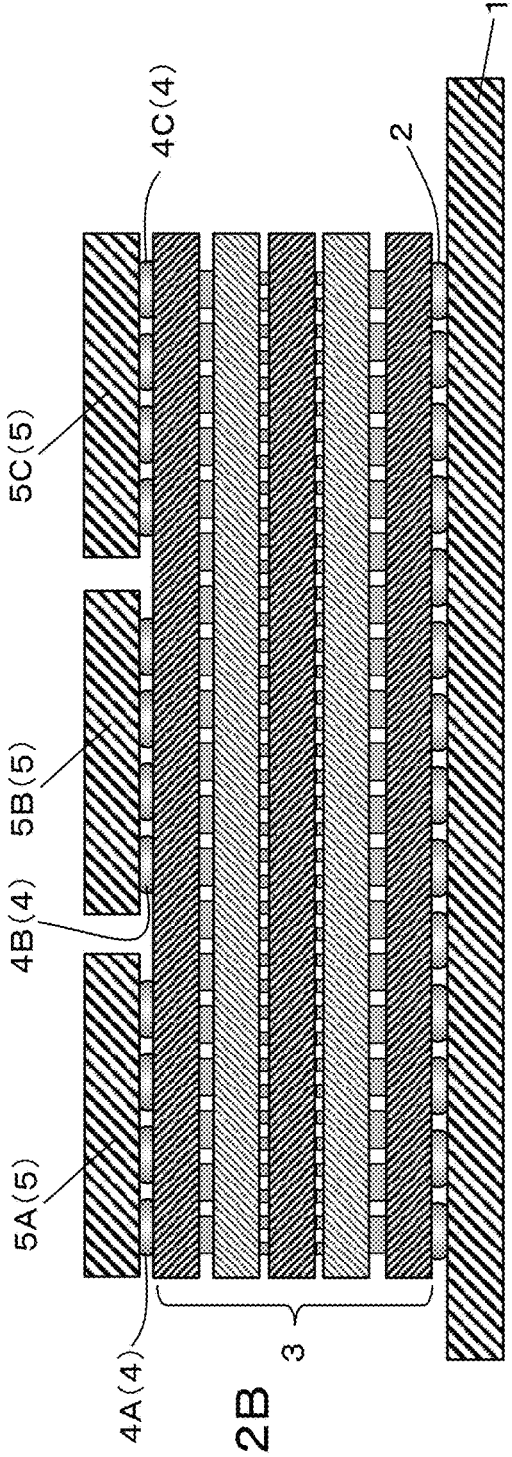

US 10,383,229 B2

ELECTRONIC APPARATUS, FABRICATION METHOD THEREFOR AND ELECTRONIC PART

CROSS-REFERENCE TO RELATED APPLICATION

This application is based upon and claims the benefit of priority of the prior Japanese Patent Application No. 2017-055403, filed on Mar. 22, 2017, the entire contents of which are incorporated herein by reference.

FIELD

The embodiments discussed herein are related to an electronic apparatus, a fabrication method therefor and an electronic part.

BACKGROUND

Downsizing and increase in density of electronic parts for use with a computer in recent years are advancing.

For downsizing and increase in density of electronic parts, development of, for example, three-dimensional integration structures and so forth is advancing.

For example, an electronic apparatus is available wherein, as depicted in FIG. 13, an electronic part 102 including a memory element and another electronic part 103 including an arithmetic element are integrated in a neighboring relationship with each other on a circuit board 100 through an interposer 101 and the electronic parts 102 and 103 are coupled to each other through the interposer 101 such that the transmission distance is reduced and movement of data is performed without delay.

SUMMARY

According to one aspect of the embodiment, an electronic apparatus includes a first circuit board, a stacked circuit that is provided on the first circuit board through first coupling terminals and has a structure in which arithmetic elements and memory elements are stacked through inter-element coupling terminals and to which a signal is inputted from the first circuit board, and a second circuit board that is provided on the stacked circuit through second coupling terminals and to which a result of processing is outputted from the stacked circuit, wherein a number of the first coupling terminals and a number of the second coupling terminals are smaller than that of the inter-element coupling terminals.

According to another aspect of the embodiment, an electronic part includes a first circuit board, a stacked circuit that is provided on the first circuit board through first coupling terminals and has a structure in which arithmetic elements and memory elements are stacked through inter-element coupling terminals and to which a signal is inputted from the first circuit board, and a second circuit board that is provided on the stacked circuit through second coupling terminals and to which a result of processing is outputted from the stacked circuit, wherein a number of the first coupling terminals and a number of the second coupling terminals are smaller than that of the inter-element coupling terminals.

According to a further aspect of the embodiment, a fabrication method for an electronic apparatus includes forming a stacked circuit in which arithmetic elements and memory elements are stacked through inter-element coupling terminals, providing the stacked circuit on a first circuit board that inputs a signal to the stacked circuit through a smaller number of first coupling terminals than that of the inter-element coupling terminals, and providing, on the stacked circuit, a second circuit board to which a result of processing is outputted from the stacked circuit through a smaller number of second coupling terminals than that of the inter-element coupling terminals.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 4 is a schematic sectional view depicting a further example of a configuration of the electronic apparatus and electronic part according to the present embodiment;

FIG. 5 is a schematic sectional view depicting a still further example of a configuration of the electronic apparatus and electronic part according to the present embodiment;

FIGS. 6A to 6E and 7A to 7E are schematic sectional views illustrating a fabrication method of the electronic apparatus (electronic part) according to the present embodiment;

FIGS. 10A and 10B are schematic sectional views illustrating a fabrication method of the electronic apparatus (electronic part) according to the present embodiment;

FIGS. 12A and 12B are schematic sectional views illustrating a fabrication method of the electronic apparatus (electronic part) according to the present embodiment;

DESCRIPTION OF PREFERRED EMBODIMENT

Incidentally, shortage in memory bandwidth is forecasted as a bottleneck to solve a large problem at a high speed by new computing such as deep learning or neurocomputing in recent years. The number of transmission paths is significant for the transmission speed of data. Therefore, the terminal number of electronic parts and the number of interconnections to be coupled to the electronic parts are taken into consideration.

Figure 14:
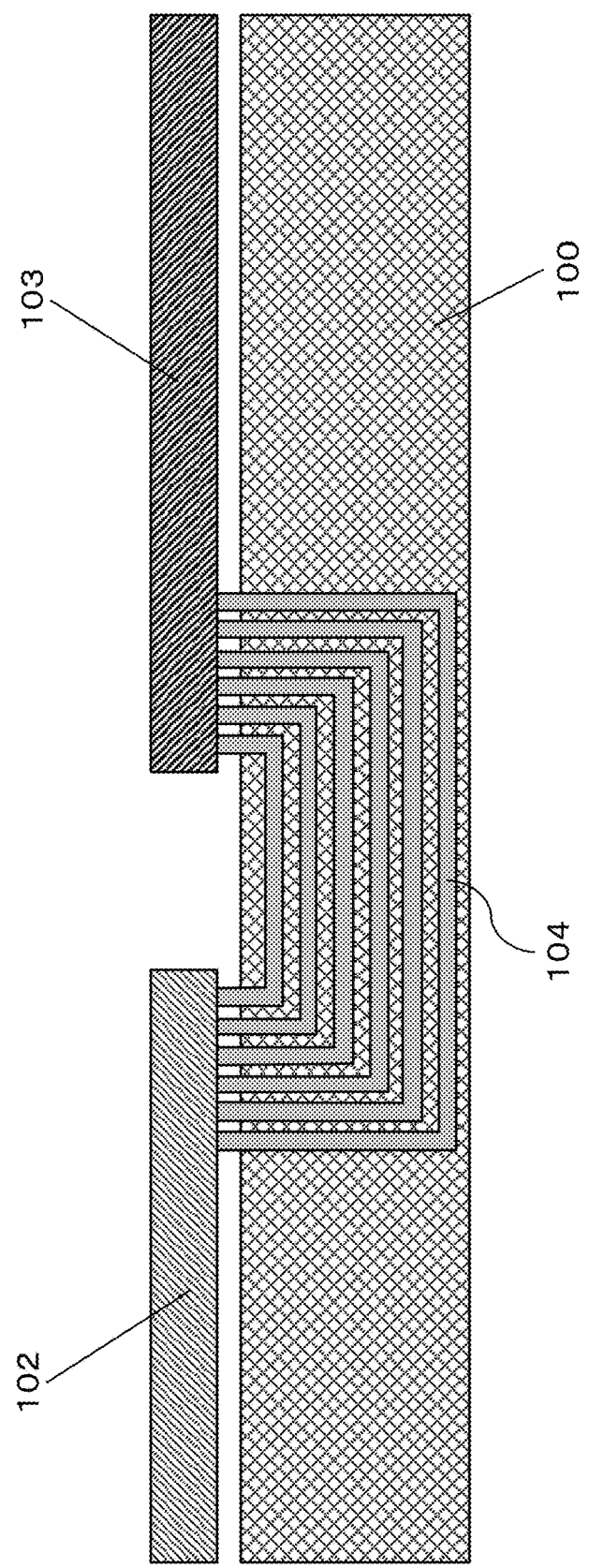
FIG. 14 is a schematic sectional view illustrating a subject of the present embodiment.

For example, as depicted in FIG. 14, if the number of terminals of electronic parts 102 and 103 increases, then this increases the number of interconnections 104 coupled to the terminals (for example, the number of interconnections to be provided on a circuit board 100 or the interposer 101; stack number of interconnection layers).

Figure 15:
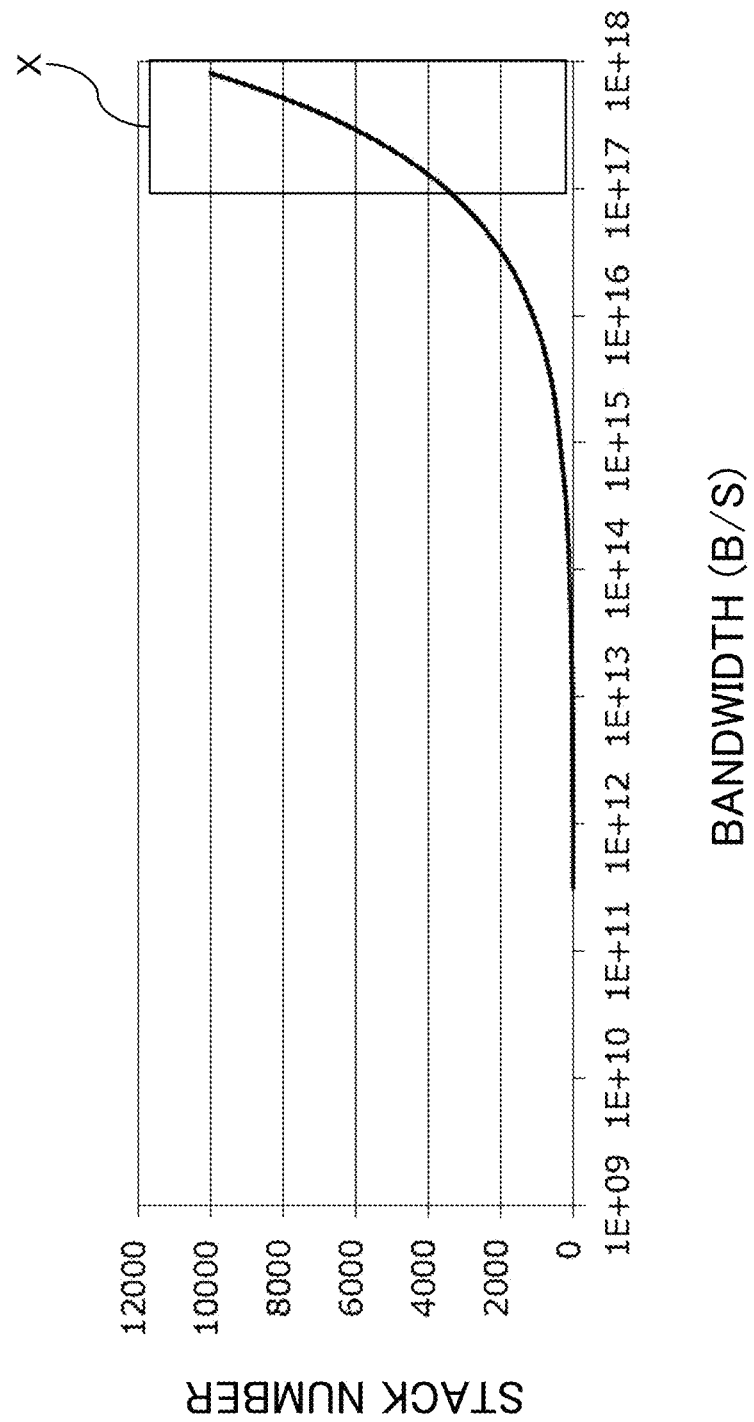
FIG. 15 is a view illustrating a subject to the present embodiment.

Here, FIG. 15 depicts a relationship between the stack number of interconnection layers and the memory bandwidth (bandwidth) when it is a premise condition that transmission is performed at approximately 2 GB/s per one interconnection (terminal; pin).

As depicted in FIG. 15, while the bandwidth increases exponentially, also the stack number of interconnection layers increases exponentially. It is to be noted that, in FIG. 15, a region indicated by reference character X indicates a bandwidth that is required in the future.

However, it is difficult to increase the stack number of interconnection layers exponentially in the future.

It is an object of the present embodiment to make it possible to secure a required memory bandwidth without increasing the stack number of interconnection layers.

In the following, an electronic apparatus and a fabrication method therefor as well as an electronic part according to the present embodiment are described with reference to FIGS. 1 to 12B.

The electronic apparatus according to the present embodiment is, for example, a server or a super computer, and includes an electronic part in which a stacked circuit including arithmetic elements and memory elements is provided on a circuit board such as, for example, a motherboard and a different circuit board is provided on the stacked circuit.

Figure 1:
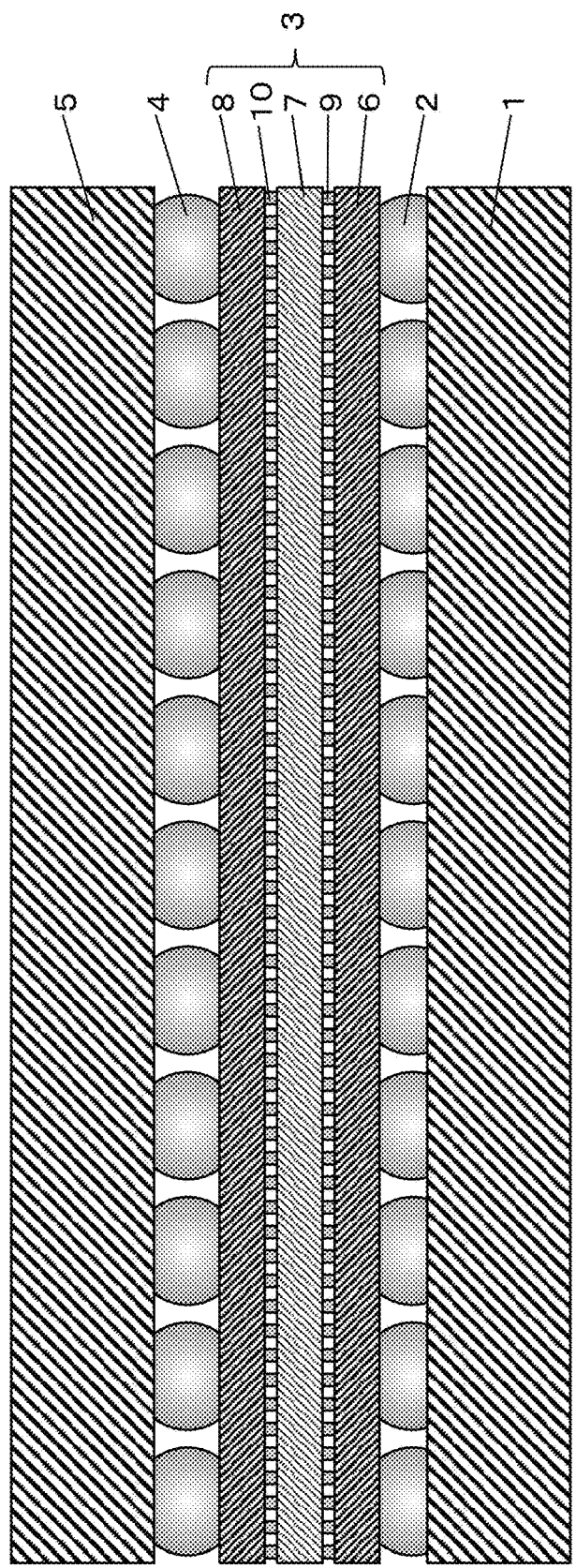
FIG. 1 is a schematic sectional view depicting an example of a configuration of an electronic apparatus and an electronic part according to an embodiment.

In particular, for example, as depicted in FIG. 1, the electronic apparatus and the electronic part of the present embodiment include a first circuit board 1, a stacked circuit 3 that is provided on the first circuit board 1 through first coupling terminals 2 and to which signals (data) are inputted from the first circuit board 1, and a second circuit board 5 that is provided on the stacked circuit 3 through second coupling terminals 4 and to which a result of processing (data; signal) is outputted from the stacked circuit 3. It is to be noted that the first coupling terminal 2 is referred to also as first coupling portion. Further, the second coupling terminal 4 is referred to also as second coupling portion.

Further, the stacked circuit 3 is structured such that an arithmetic element 6 (8) and a memory element 7 are stacked through inter-element coupling terminals 9 (10). It is to be noted that the inter-element coupling terminals 9 (10) are each referred to also as inter-element coupling portion, in-stacked circuit coupling terminal or stacked circuit internal coupling portion.

The number of first coupling terminals 2 and the number of second coupling terminals 4 are smaller than the number of inter-element coupling terminals 9 (10).

Here, the stacked circuit 3 has a three-layer stacked structure in which the arithmetic element 6, memory element 7 and arithmetic element 8 are stacked in order with the inter-element coupling terminals 9 and 10 interposed therebetween, respectively. In particular, the stacked circuit 3 is structured such that a layer including the arithmetic element 6, another layer including the inter-element coupling terminals 9, a further layer including the memory element 7, a still further layer including the inter-element coupling terminals 10 and a yet further layer including the arithmetic element 8 are stacked in order.

In this manner, the arithmetic elements 6 and 8 are provided at the side near to the first circuit board 1 and the side near to the second circuit board 5, respectively. In particular, elements configuring the lowermost layer and the uppermost layer of the stacked circuit 3 are the arithmetic elements 6 and 8, respectively, and the arithmetic elements 6 and 8 are coupled to the upper and lower circuit boards 1 and 5, respectively.

Therefore, a signal transmitted to the first circuit board 1 or the second circuit board 5 is a simple signal such as, for example, a result of arithmetic operation, and since the number of terminals required for coupling to the circuit boards 1 and 5 decreases, increase of the number of interconnection layers to be provided on the circuit boards 1 and 5 can be suppressed.

It is to be noted that the stack number of the arithmetic elements and the memory elements configuring the stacked circuit 3 is not limited to this.

Further, each of the first coupling terminals 2 is a terminal for electrically coupling the first circuit board 1 and the stacked circuit 3 to each other and is a solder bump configured from a solder material based on, for example, Sn. It is to be noted that the first coupling terminal 2 is referred to also as first metal coupling portion.

Further, each second coupling terminal 4 is a terminal for electrically coupling the second circuit board 5 and the stacked circuit 3 to each other and is a solder bump configured from a solder material based on, for example, Sn. It is to be noted that the second coupling terminal 4 is referred to also as second metal coupling portion.

It is to be noted that preferably the solder bump configuring the second coupling terminal 4 has a melting point lower than that of the solder bump configuring the first coupling terminal 2.

Consequently, when the second circuit board 5 is coupled to the stacked circuit 3 through the solder bumps configuring the second coupling terminals 4 after the stacked circuit 3 is coupled to the first circuit board 1 through the solder bumps configuring the first coupling terminals 2, melting of the solder bumps configuring the first coupling terminals 2 can be suppressed, and the yield can be enhanced.

Further, the inter-element coupling terminals 9 and 10 are terminals for electrically coupling the arithmetic elements 6 and 8 and the memory element 7 included in the stacked circuit 3 to each other and are individually configured, for example, from direct coupling of Cu pillars to each other or a micro bump. Consequently, finer coupling than the coupling by the first coupling terminals 2 or the second coupling terminals 4 can be implemented, and consequently, a number of terminals required for securing a desired memory bandwidth can be secured. It is to be noted that each of the inter-element coupling terminals 9 and 10 is referred to also as inter-element metal coupling portion or fine coupling portion.

As described above, the electronic apparatus and the electronic part of the present embodiment are individually structured such that the stacked circuit 3 in which at least one arithmetic element 6 (8) and at least one memory element 7 are stacked is sandwiched by the circuit boards 1 and 5 from the opposite sides in the upward and downward direction, and the number of coupling terminals between the circuit boards 1 and 5 and the stacked circuit 3 is smaller than the number of coupling terminals in the stacked circuit 3.

In this manner, by coupling the arithmetic element 6 (8) and the memory element 7 stacked in the stacked circuit 3 to each other through the fine coupling terminals 9 (10), a number of terminals required to secure a desired memory bandwidth are secured and a process in which a great bandwidth is required is completed only by coupling in the stacking direction (Z direction) by the fine coupling terminals 9 (10).

Further, since the electronic apparatus and the electronic part are configured such that signals (data) are inputted (transmitted) from the circuit board 1 at one side and only results of processing (data; signals) are outputted (transmitted) from the circuit board 5 at the other side thereby to reduce the number of coupling terminals between the circuit boards 1 and 5 and the stacked circuit 3, even if the bandwidth increases exponentially, the number of stacked layers of the interconnection layers provided on the circuit boards 1 and 5 can be suppressed from increasing exponentially and increase of the number of stacked layers of the interconnection layers can be suppressed. As a result, the yield can be enhanced.

Figure 2A:
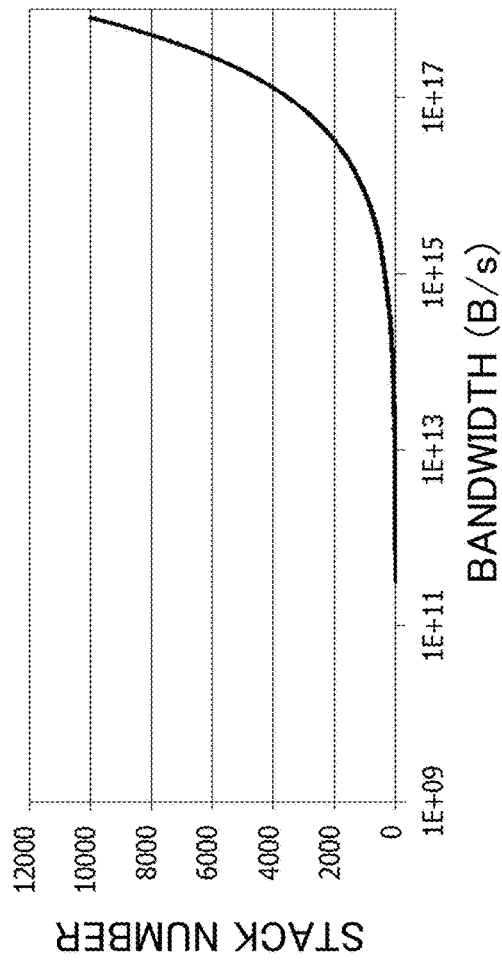
FIG. 2A is a view depicting a relationship between the bandwidth and the stack number of interconnection layers in a conventional electronic apparatus and electronic part and FIG. 2B is a view depicting a relationship between the bandwidth and the stack number of interconnection layers in the electronic apparatus and electronic part according to the present embodiment.
Figure 13:
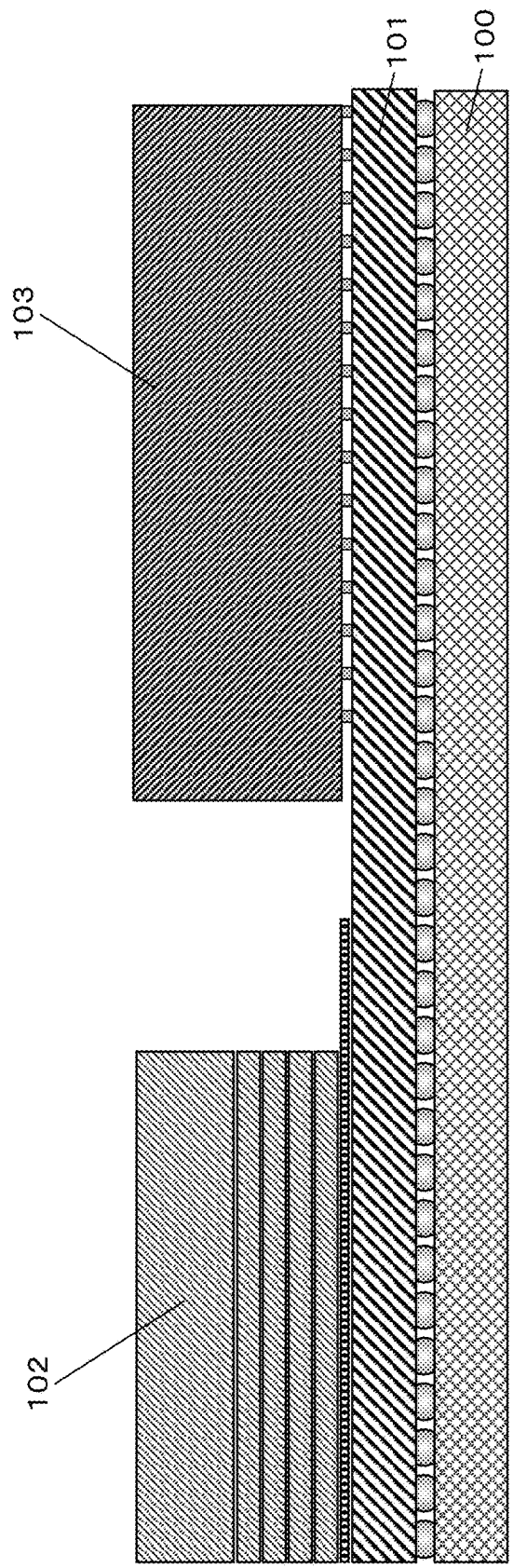
FIG. 13 is a schematic sectional view depicting a configuration of a conventional electronic apparatus (electronic part)

For example, where an electronic apparatus (electronic part) has such a structure as depicted in FIG. 13, exponential increase of the bandwidth exponentially increases also the number of stacked layers of the interconnection layers as depicted in FIG. 2A.

Figure 2B:
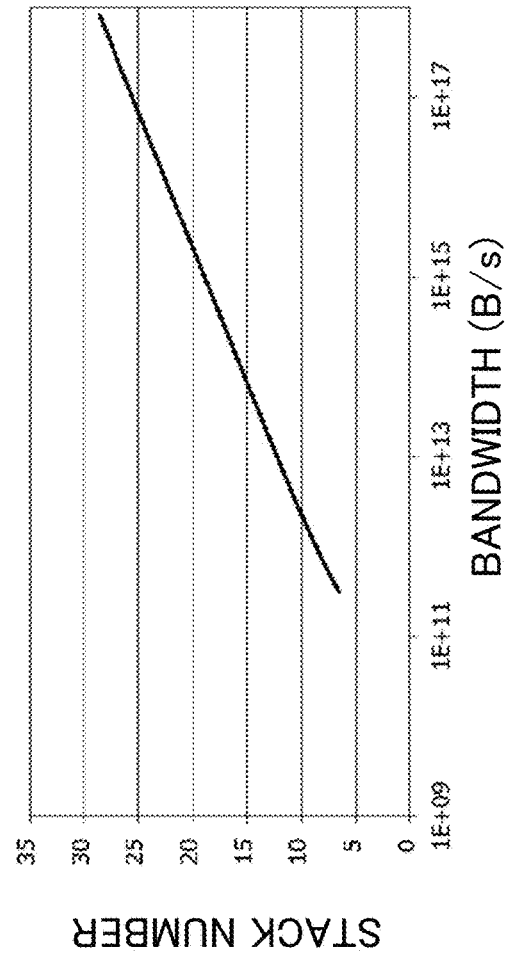

In contrast, where the electronic apparatus and the electronic part are configured in such a manner as in the embodiment described above, even if the bandwidth increases exponentially, the number of stacked layers of the interconnection layers can increase linearly as depicted in FIG. 2B. Therefore, it is recognized that the structure of the present embodiment is suitable for a high bandwidth that is expected to be demanded in the future. For example, the present embodiment is effective for a high bandwidth of 2 TB/s or more.

Next, a fabrication method for the electronic apparatus (electronic part) configured in such a manner as described above may include a step of forming a stacked circuit 3 in which an arithmetic element 6 (8) and a memory element 7 are stacked with inter-element coupling terminals 9 (10) interposed therebetween, a step of providing the stacked circuit 3 on a first circuit board 1 that inputs a signal to the stacked circuit 3 through a smaller number of first coupling terminals 2 than that of the inter-element coupling terminals 9 (10), and a step of providing a second circuit board 5 to which a result of processing is outputted from the stacked circuit 3 on the stacked circuit 3 through a smaller number of second coupling terminals 4 than that of the inter-element coupling terminals 9 (10). It is to be noted that a particular example is hereinafter described.

Incidentally, while the foregoing embodiment is described taking, as an example, the stacked circuit 3 having a three-layer stacked structure in which the arithmetic element 6, memory element 7 and arithmetic element 8 are stacked in order, the stacked structure of the stacked circuit 3 is not limited to this.

For example, the stacked circuit 3 may be structured such that an arithmetic element and a memory element are stacked alternately such that the number of inter-element coupling terminals positioned at the first circuit board 1 side and the second circuit board 5 side is smaller than that of the inter-element coupling terminals positioned at a central location in the stacking direction.

Figure 3:
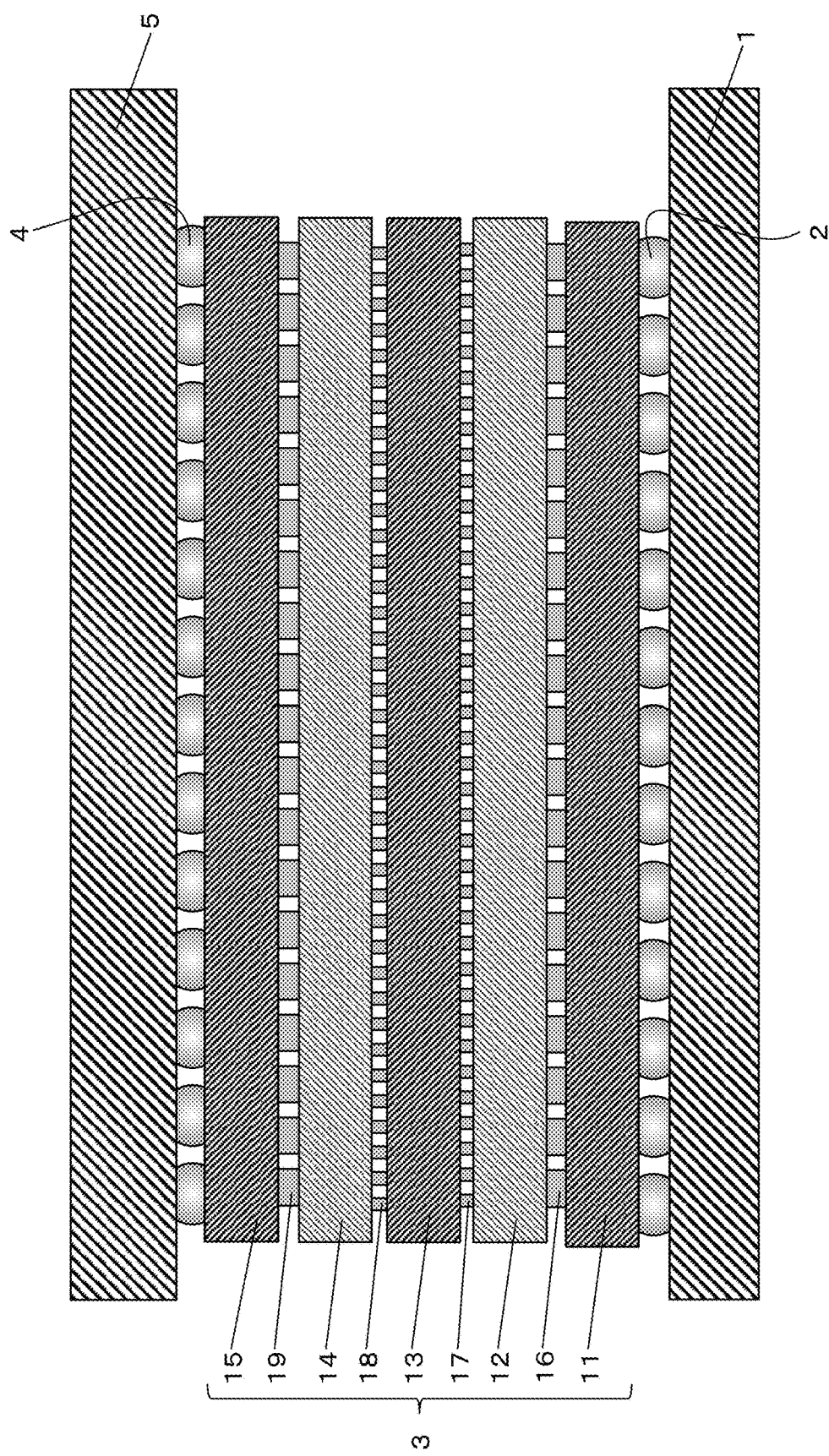
FIG. 3 is a schematic sectional view depicting another example of a configuration of the electronic apparatus and electronic part according to the present embodiment.

For example, as depicted in FIG. 3, the stacked circuit 3 may have a five-layer stacked structure in which an arithmetic element 11, a memory element 12, another arithmetic element 13, another memory element 14 and a further arithmetic element 15 are stacked in order with inter-element coupling terminals 16 to 19 interposed therebetween, respectively. In particular, the stacked circuit 3 may be structured such that a layer including the arithmetic element 11, another layer including the inter-element coupling terminals 16, a further layer including the memory element 12, a still further layer including the inter-element coupling terminals 17, a yet further layer including the arithmetic element 13, a yet further layer including the inter-element coupling terminals 18, a yet further layer including the memory element 14, a yet further layer including the inter-element coupling terminals 19 and a yet further layer including the arithmetic element 15 are stacked in order. Further, the number of inter-element coupling terminals 16 and 19 positioned at the first circuit board 1 side and the second circuit board 5 side may be set smaller than that of the inter-element coupling terminals 17 and 18 positioned at a central location in the stacking direction.

In this manner, the number of inter-element coupling terminals may be set so as to decrease gradually (step by step) from the central location in the stacking direction toward the first circuit board 1 side and the second circuit board 5 side. In particular, the number of inter-element coupling terminals included in a plurality of layers including the inter-element coupling terminals may be set so as to decrease gradually from the central location in the stacking direction toward the first circuit board 1 side and the second circuit board 5 side. In this case, the size of the inter-element coupling terminals may increase gradually from the central location in the stacking direction toward the first circuit board 1 side and the second circuit board 5 side.

In this case, in the fabrication method for an electronic apparatus (electronic part), the step of forming the stacked circuit 3 included in the fabrication method of the embodiment described above may be configured such that an arithmetic element 11, 13 or 15 and a memory element 12 or 14 are stacked alternately such that the number of inter-element coupling terminals 16 and 19 positioned at the first circuit board 1 side and the second circuit board 5 side is smaller than that of the inter-element coupling terminals 17 and 18 positioned at the central location in the stacking direction.

Further, for example, the stacked circuit 3 may be configured such that it has a structure in which an arithmetic element and a memory element are stacked alternately and the number of inter-element coupling terminals positioned at the first circuit board 1 side is smaller than that of the inter-element coupling terminals positioned at the second circuit board 5 side.

For example, as depicted in FIG. 4, the stacked circuit 3 may have a five-layer stacked structure in which the arithmetic element 11, memory element 12, arithmetic element 13, memory element 14 and arithmetic element 15 are stacked in order with the inter-element coupling terminals 16 to 19 interposed therebetween, respectively. In particular, the stacked circuit 3 may be structured such that a layer including the arithmetic element 11, another layer including the inter-element coupling terminals 16, a further layer including the memory element 12, a still further layer including the inter-element coupling terminals 17, a yet further layer including the arithmetic element 13, a yet further layer including the inter-element coupling terminals 18, a yet further layer including the memory element 14, a yet further layer including the inter-element coupling terminals 19 and a yet further layer including the arithmetic element 15 are stacked in order. Further, the number of inter-element coupling terminals 16 positioned at the first circuit board 1 side may be set smaller than that of the inter-element coupling terminals 19 positioned at the second circuit board 5 side.

Here, the number of inter-element coupling terminals 16 to 19 decreases gradually (step by step) from the second circuit board 5 side toward the first circuit board 1 side. In particular, the number of inter-element coupling terminals 16 to 19 included in a plurality of layers including the inter-element coupling terminals 16 to 19 decreases gradually from the second circuit board 5 side toward the first circuit board 1 side. Further, the size of the inter-element coupling terminals 16 to 19 here increases gradually from the second circuit board 5 side toward the first circuit board 1 side.

In this case, the fabrication method for an electronic apparatus (electronic part) may be configured such that, at the step of forming the stacked circuit 3 included in the fabrication method of the embodiment described above, an arithmetic element 11, 13 or 15 and a memory element 12 or 14 are stacked alternately such that the number of inter-element coupling terminals 16 positioned at the first circuit board 1 side is smaller than that of the inter-element coupling terminals 19 positioned at the second circuit board 5 side.

Further, for example, the stacked circuit 3 may be structured such that an arithmetic element and a memory element are stacked alternately such that the number of inter-element coupling terminals positioned at the second circuit board 5 side is smaller than that of the inter-element coupling terminals positioned at the first circuit board 1 side.

For example, as depicted in FIG. 5, the stacked circuit 3 may have a five-layer stacked structure in which the arithmetic element 11, memory element 12, arithmetic element 13, memory element 14 and arithmetic element 15 are stacked in order with the inter-element coupling terminals 16 to 19 interposed therebetween, respectively. In particular, the stacked circuit 3 may be structured such that a layer including the arithmetic element 11, another layer including the inter-element coupling terminals 16, a further layer including the memory element 12, a still further layer including the inter-element coupling terminals 17, a yet further layer including the arithmetic element 13, a yet further layer including the inter-element coupling terminals 18, a yet further layer including the memory element 14, a yet further layer including the inter-element coupling terminals 19 and a yet further layer including the arithmetic element 15 are stacked in order. Further, the number of inter-element coupling terminals 19 positioned at the second circuit board 5 side may be smaller than that of the inter-element coupling terminals 16 positioned at the first circuit board 1 side.

Here, the number of inter-element coupling terminals 16 to 19 is decreased gradually (step by step) from the first circuit board 1 side toward the second circuit board 5 side. In particular, the number of inter-element coupling terminals 16 to 19 included in a plurality of layers including the inter-element coupling terminals 16 to 19 decreases gradually from the first circuit board 1 side toward the second circuit board 5 side. Further, the size of the inter-element coupling terminals 16 to 19 here gradually increases from the first circuit board 1 side toward the second circuit board 5 side.

In this case, in the fabrication method for an electronic apparatus (electronic part), the step of forming the stacked circuit 3 included in the fabrication method of the embodiment described above may be structured such that an arithmetic element 11, 13 or 15 and a memory element 12 or 14 are stacked alternately such that the number of inter-element coupling terminals 19 positioned at the second circuit board 5 side is smaller than that of the inter-element coupling terminals 16 positioned at the first circuit board 1 side.

As described above, the stacked circuit 3 is configured including a plurality of arithmetic elements 11, 13 and 15 such that a result of arithmetic operation in one arithmetic element 11 (13) is sent to the other arithmetic element 13 (15) through the memory element 12 (14) and the arithmetic operation processes by the plurality of arithmetic elements 11, 13 and 15 are performed successively. By the configuration, the number of inter-element coupling terminals 16 to 19 can be increased gradually or can be decreased gradually.

It is to be noted that the case in which an arithmetic element and a memory element are stacked alternately includes also a case in which, for example, a plurality of arithmetic elements are set as one set of arithmetic elements and one set of arithmetic elements and one memory element are stacked alternately. Further, the stacked circuit 3 may be structured such that an arithmetic element and a memory element are stacked with inter-element coupling terminals interposed therebetween, and, for example, an element other than an arithmetic element and a memory element (for example, a driver) may be included.

A fabrication method for an electronic apparatus (electronic part) of the present embodiment is described in detail below with reference to FIGS. 6A to 6E and 7A to 7E.

Here, description is given taking, as an example, a case in which the stacked circuit 3 has such a five-layer stacked structure as depicted in FIG. 3.

First, as depicted in FIGS. 6A to 6E, a stacked circuit 3 in which three arithmetic elements 11, 13 and 15 and two memory element 12 and 14 are stacked with inter-element coupling terminals 16 to 19 interposed therebetween, respectively, is formed.

In particular, first, as depicted in FIG. 6A, an arithmetic element 11 that is to configure a first layer and a memory element 12 that is to configure a second layer are coupled to each other by coupling by micro bumps or by Cu-Cu direct coupling by Cu pillars, and the memory element 12 configuring the second layer is stacked on the arithmetic element 11 configuring the first layer through inter-element coupling terminals (coupling portions) 16 each configured from a micro bump or a Cu pillar.

Then, an arithmetic element 13 that is to configure a third layer is stacked on the memory element 12 configuring the second layer through inter-element coupling terminals (fine coupling portions) 17 finer than the inter-element coupling terminals 16 described hereinabove as depicted in FIGS. 6B and 6C.

Here, the arithmetic element 13 configuring the third layer is coupled to the memory element 12 configuring the second layer by Cu-Cu direct coupling by finer Cu pillars than the micro bumps or the Cu pillars used to couple the arithmetic element 11 configuring the first layer and the memory element 12 configuring the second layer to each other. Further, the number of fine inter-element coupling terminals 17 for coupling the memory element 12 configuring the second layer and the arithmetic element 13 configuring the third layer to each other here is greater than the number of inter-element coupling terminals 16 described above for coupling the arithmetic element 11 configuring the first layer and the memory element 12 configuring the second layer to each other.

Thereafter, steps similar to those described above are repetitively performed such that a memory element 14 that is to configure a fourth layer is stacked on the arithmetic element 13 configuring the third layer through fine inter-element coupling terminals 18 having a size equal to that of the fine inter-element coupling terminals 17 described above and an arithmetic element 15 that is to configure a fifth layer is stacked on the memory element 14 configuring the fourth layer through inter-element coupling terminals 19 having a size equal to that of the inter-element coupling terminals 16 described above.

Here, an item is formed in which the memory element 14 configuring the fourth layer is stacked on the arithmetic element 15 configuring the fifth layer through the inter-element coupling terminals 19 configured from micro bumps or Cu pillars similarly as at the step described hereinabove with reference to FIG. 6A. Then, the item is stacked on the item formed at the steps depicted in FIGS. 6B and 6C described hereinabove as depicted in FIG. 6D. Consequently, as depicted in FIG. 6E, the stacked circuit 3 is formed in which the three arithmetic elements 11, 13 and 15 and the two memory elements 12 and 14 are stacked with the inter-element coupling terminals 16 to 19 interposed therebetween, respectively.

It is to be noted here that the number of fine inter-element coupling terminals 18 for coupling the arithmetic element 13 configuring the third layer and the memory element 14 configuring the fourth layer to each other is equal to the number of fine inter-element coupling terminals 17 described hereinabove for coupling the memory element 12 configuring the second layer and the arithmetic element 13 configuring the third layer to each other. Further, the number of inter-element coupling terminals 19 for coupling the memory element 14 configuring the fourth layer and the arithmetic element 15 configuring the fifth layer to each other is equal to the number of inter-element coupling terminals 16 described above for coupling the arithmetic element 11 configuring the first layer and the memory element 12 configuring the second layer.

The stacked circuit (stacked unit) 3 having a five-layer stacked structure in which the arithmetic elements 11, 13 and 15 and the memory elements 12 and 14 are stacked repetitively with the inter-element coupling terminals 16 to 19 interposed therebetween, respectively, is formed in this manner.

Then, the stacked circuit 3 formed in this manner is provided on the circuit board (first circuit board) 1 for inputting a signal to the stacked circuit 3 as depicted in FIGS. 7A to 7D.

In particular, flux 20 is first applied to the first circuit board 1 to provide solder bumps as the coupling terminals (first coupling terminal) 2 as depicted in FIGS. 7A and 7B.

Then, the stacked circuit 3 formed as described above is mounted on the first circuit board 1 on which the solder bumps 2 are provided and the solder bumps 2 are reflowed such that the first circuit board 1 and the stacked circuit 3 are coupled to each other by the solder bumps 2 thereby to provide the stacked circuit 3 on the first circuit board 1 through the solder bumps 2 as depicted in FIGS. 7C and 7D.

Here, the solder bumps as the first coupling terminals 2 have a size greater than that of the micro bumps or the Cu pillars as the inter-element coupling terminals 16 to 19 for coupling the arithmetic elements 11, 13 and 15 and the memory elements 12 and 14 configuring the stacked circuit 3 described above to each other. Further, the number of solder bumps as the first coupling terminals 2 here is smaller than that of the inter-element coupling terminals 16 to 19 for coupling the arithmetic elements 11, 13 and 15 and the memory elements 12 and 14 configuring the stacked circuit 3 described above to each other.

In this manner, the stacked circuit 3 is provided on the first circuit board 1 that inputs a signal to the stacked circuit 3 through a smaller number of the first coupling terminals 2 than that of the inter-element coupling terminals 16 to 19.

Then, as depicted in FIG. 7E, a circuit board (second circuit board) 5 to which a result of the process is outputted from the stacked circuit 3 is provided on the stacked circuit 3.

In particular, the second circuit board 5 on which solder bumps as the coupling terminals (second coupling terminals) 4 are provided is placed on the stacked circuit 3 and the solder bumps are reflowed to couple the stacked circuit 3 and the second circuit board 5 to each other by the solder bumps 4 thereby to provide the second circuit board 5 on the stacked circuit 3 through the solder bumps 4.

Here, the solder bumps as the second coupling terminals 4 have a size greater than that of the micro bumps or the Cu pillars as the inter-element coupling terminals 16 to 19 for coupling the arithmetic elements 11, 13 and 15 and the memory elements 12 and 14 configuring the stacked circuit 3 described above. Further, the number of solder bumps as the second coupling terminals 4 is smaller than that of the inter-element coupling terminals 16 to 19 for coupling the arithmetic elements 11, 13 and 15 and the memory elements 12 and 14 configuring the stacked circuit 3 described above.

In this manner, the second circuit board 5 to which a result of a process is outputted from the stacked circuit 3 is provided on the stacked circuit 3 through the number of second coupling terminals 4 smaller than that of the inter-element coupling terminals 16 to 19.

The electronic part including the stacked circuit 3 having such a five-layer stacked structure as depicted in FIG. 3 can be fabricated in such a manner as described above, and an electronic apparatus such as, for example, a server can be fabricated as an apparatus that includes such an electronic part as just described.

Incidentally, it is preferable to configure an arithmetic element included in the stacked circuit 3 such that it performs arithmetic operation based on a signal (data) inputted from one side in the stacking direction and outputs a result of the arithmetic operation to the other side in the stacking direction.

For example, it is preferable to configure the stacked circuit 3 configured in such a manner as depicted in FIG. 1 such that the arithmetic element 6 at the lower side performs arithmetic operation based on a signal (data) inputted from the first circuit board 1 and outputs a result of the arithmetic operation to the memory element 7 and that the arithmetic element 8 at the upper side performs arithmetic operation based on a signal (data) inputted from the memory element 7 and outputs a result of the arithmetic operation to the second circuit board 5.

Further, it is preferable to configure, for example, the stacked circuit 3 configured in such a manner as depicted in FIGS. 3, 4 and 5 such that the arithmetic element 11 at the lower side performs arithmetic operation based on a signal (data) inputted from the first circuit board 1 and outputs a result of the arithmetic operation to the memory element 12 at the lower side, that the arithmetic element 13 at the intermediate location performs arithmetic operation based on a signal (data) inputted from the memory element 12 at the lower side and outputs a result of the arithmetic operation to the memory element 14 at the upper side and that the arithmetic element 15 at the upper side performs arithmetic operation based on a signal (data) inputted from the memory element 14 at the upper side and outputs a result of the arithmetic operation to the second circuit board 5.

In those cases, data is inputted from one side in the stacking direction and data is outputted to the other side in the stacking direction, and the data flows in one direction as in non-von Neumann type computing. Further, the arithmetic element reads out data from the memory element and writes the data into a different memory element without returning the data to the same memory element. Therefore, since an interconnection layer for changing over a flow of data from the stacking direction (Z direction) to an in-plane direction (XY plane direction) to return the data, for example, in the arithmetic element or the stacked circuit may not be provided, even if the bandwidth increases exponentially, the stack number of interconnection layers does not increase exponentially and increase of the stack number of interconnection layers can be moderated.

It is to be noted that, even if the memory element and the arithmetic element are structured such that they are stacked with the coupling terminals interposed therebetween, for example, in order to decrease the number of interconnection layers in the circuit board or the like for coupling the electronic parts, if the arithmetic element reads out data from the memory element and writes the data back into the same memory element as in Neumann type computing, then the interconnection layer for changing over a flow of data from the Z direction to the XY plane direction so as to return the data is provided in the inside of the arithmetic element or the like. Therefore, if the bandwidth increases exponentially, then also the stack number of interconnection layers increases exponentially.

Accordingly, the electronic apparatus and the fabrication method therefor as well as the electronic part according to the present embodiment have an advantageous effect that a required memory bandwidth can be secured without increasing the stack number of interconnection layers.

Incidentally, while, in the embodiment and the modification described above, the stacked circuit 3 is provided between the first circuit board 1 and the second circuit board 5, the embodiment is not limited to this.

Figure 8:
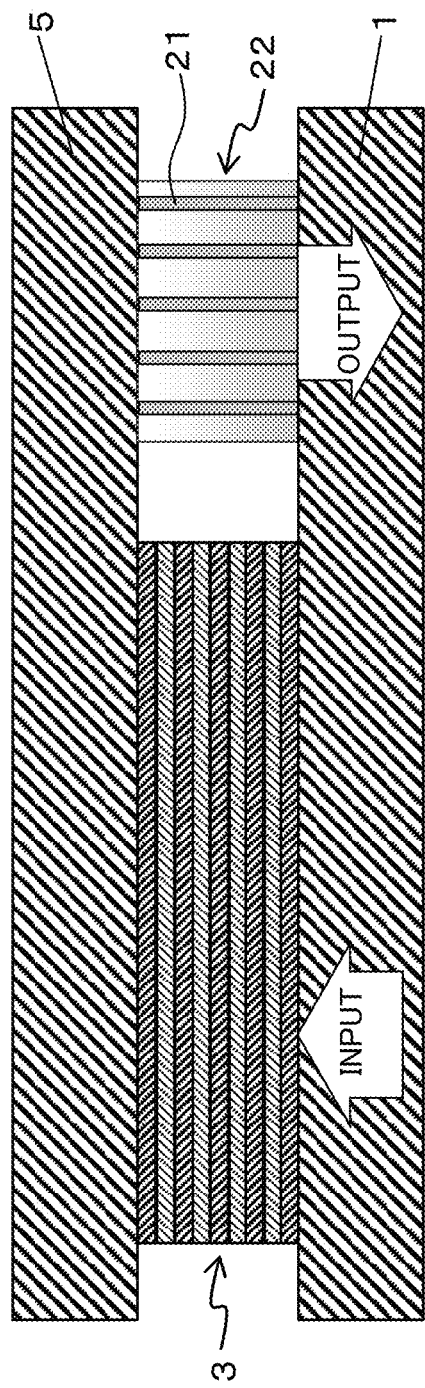
FIG. 8 is a schematic sectional view depicting a configuration of a modification to the electronic apparatus and the electronic part according to the present embodiment.

For example, as depicted in FIG. 8, a structure body 22 including through vias 21 may be provided between the first circuit board 1 and the second circuit board 5 such that data (result of arithmetic operation) outputted from the stacked circuit 3 to the second circuit board 5 is returned to the first circuit board 1 through the through vias 21 included in the structure body 22.

In this case, a signal inputted from the first circuit board 1 passes through the stacked circuit 3, and a result of arithmetic operation is outputted (transmitted) to the second circuit board 5. Then, the arithmetic operation result is outputted (transmitted) from the second circuit board 5 to the first circuit board 1 through a through vias 21 included in the structure body 22.

Further, in this case, a portion other than the structure body 22 including the through vias 21 is configured similarly to that of the embodiment and the modification described above, and a process for which a high bandwidth is required is performed only between the arithmetic element and the memory element coupled by the fine coupling portions in the stacked circuit (stacked body) 3 and only a result of the process is transmitted to the second circuit board 5. Therefore, since the number of terminals required for coupling the stacked circuit 3 and the second circuit board 5 to each other decreases and a signal that passes through the second circuit board 5 is simplified, increase of the number of interconnection layers provided on the second circuit board 5 can be suppressed. Accordingly, also where data (signal) is returned from the second circuit board 5 to the first circuit board 1 by the structure body 22 including the through vias 21, the stack number of interconnection layers included in the second circuit board 5 does not increase exponentially with respect to the bandwidth that increases exponentially.

Figure 9:
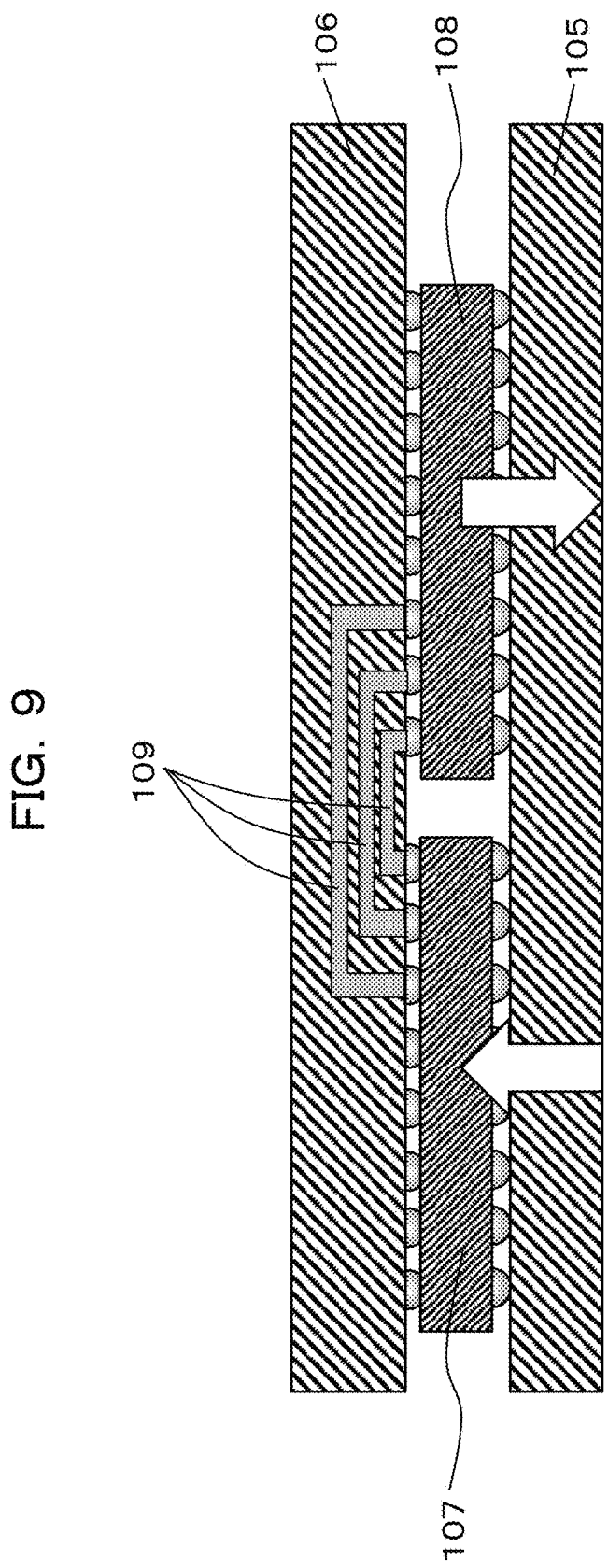
FIG. 9 is a view illustrating a subject of a comparative example.

It is to be noted that, for example, as depicted in FIG. 9, if data (signal) is returned to a circuit board 105 at the lower side where a structure is adopted in which an arithmetic element 107 and a memory element 108 are placed side by side and sandwiched by upper and lower circuit boards 105 and 106, then also the stack number of interconnection layers 109 provided on the circuit board 106 at the upper side increases exponentially with respect to the bandwidth that increases exponentially.

Further, in this case, in the fabrication method for an electronic apparatus (electronic part), the step of providing the stacked circuit 3 included in the fabrication method of the embodiment described above is configured such that also the structure body 22 including the through vias 21 is provided on the first circuit board 1, for example, as depicted in FIG. 10A, and, the step of providing the second circuit board 5 may be configured such that the second circuit board 5 is provided on the stacked circuit 3 and the structure body 22, for example, as depicted in FIG. 10B. It is to be noted that FIGS. 10A and 10B exemplify a case in which the stacked circuit 3 has such a structure as depicted in FIG. 3.

Here, the structure body 22 including the through vias 21 may be coupled to the first circuit board 1 and the second circuit board 5 through solder bumps (coupling terminals) 23 and 24, respectively. In particular, the stacked circuit 3 and the structure body 22 that includes the through vias 21 maybe coupled to the first circuit board 1 by the solder bumps 23 and the stacked circuit 3 and the structure body 22 that includes the through vias 21 may be coupled by the solder bumps 24 such that both of them are coupled to the second circuit board 5. In this case, it is preferable for the solder bumps 23 used for coupling to the first circuit board 1 and the solder bumps 24 used for coupling to the second circuit board 5 to have an equal size (diameter). Further, the area of the stacked circuit 3 is set smaller than that of the second circuit board 5.

Figure 11:
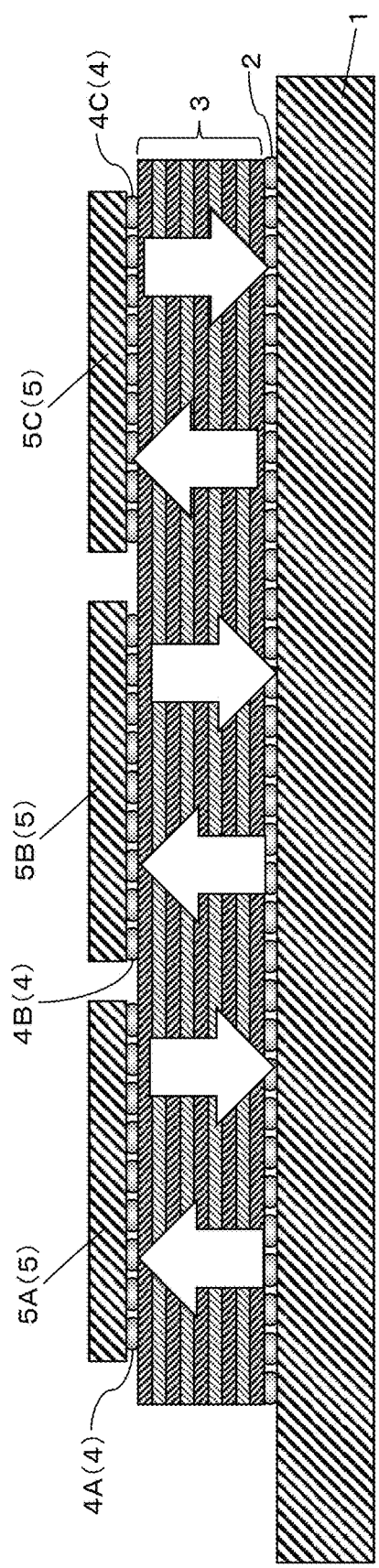
FIG. 11 is a schematic sectional view depicting a configuration of a modification to the electronic apparatus and an electronic part according to the present embodiment.

Further, while, in the embodiment and the modification described above, one circuit board is provided as the second circuit board 5, the present embodiment is not limited to this and, for example, as depicted in FIG. 11, a plurality of circuit boards 5A to 5C may be provided as the second circuit board 5. In particular, a plurality of circuit boards 5A to 5C may be provided as the second circuit board 5 on the stacked circuit 3.

In this case, the stacked circuit 3 is sandwiched between one circuit board as the first circuit board 1 and the plurality of circuit boards 5A to 5C as the second circuit board 5.

Here, the first circuit board 1 is, for example, a motherboard and the plurality of circuit boards 5A to 5C as the second circuit board 5 are, for example, chips such as ASICs, and the stacked circuit 3 functions, for example, as an interposer.

A signal inputted from the first circuit board 1 passes through the stacked circuit 3 and a result of arithmetic operation is outputted from the stacked circuit 3 to the circuit boards 5A to 5C as the second circuit board 5. Then, the signal is returned from the circuit boards 5A to 5C as the second circuit board 5 to the stacked circuit 3 while the result of the arithmetic operation is outputted from the stacked circuit 3 to the first circuit board 1.

In this case, the plurality of circuit boards 5A to 5C as the second circuit board 5 may be coupled to each other through the stacked circuit 3 and the first circuit board 1. For example, in FIG. 11, a signal returned from the left side circuit board 5A from among the plurality of circuit boards 5A to 5C as the second circuit board 5 to the first circuit board 1 through the stacked circuit 3 may be sent from the first circuit board 1 to the central circuit board 5B through the stacked circuit 3, and the signal returned from the central circuit board 5B to the first circuit board 1 through the stacked circuit 3 may be sent from the first circuit board 1 to the right side circuit board 5C through the stacked circuit 3.

Further, in this case, the stacked circuit 3 is configured similarly to that in the embodiment described above, and a process for which a high bandwidth is required is performed only between an arithmetic element and a memory element coupled by a fine coupling portion in the stacked circuit 3 and only a result of the process is transmitted to the second circuit board 5 or the first circuit board 1.

Therefore, since the number of terminals required to couple the stacked circuit 3 and the circuit boards 5A to 5C as the second circuit board 5 to each other decreases, increase of the number of interconnection layers to be provided on the circuit boards 5A to 5C as the second circuit board 5 can be suppressed. Further, since the number of terminals required to couple the stacked circuit 3 and the first circuit board 1 to each other decreases, increase of the number of interconnection layers to be provided on the first circuit board 1 can be suppressed.

Accordingly, also where data (signal) is returned from the circuit boards 5A to 5C as the second circuit board 5 to the first circuit board 1 or where the signal returned from one of the plurality of circuit boards 5A to 5C as the second circuit board 5 to the first circuit board 1 is to be sent from the first circuit board 1 to a different circuit board from among the plurality of circuit boards 5A to 5C as the second circuit board 5 through the stacked circuit 3, the stack number of interconnection layers included in the circuit boards 5A to 5C as the second circuit board 5 or the first circuit board 1 does not increase exponentially with respect to the bandwidth that increases exponentially.

In this case, the fabrication method for an electronic apparatus (electronic part) may be configured such that, at the step of providing the second circuit board 5 included in the fabrication method of the embodiment described above, the plurality of circuit boards 5A to 5C are provided as the second circuit board 5 as depicted in FIGS. 12A and 12B. In particular, as depicted in FIGS. 12A and 12B, solder bumps 4A to 4C may be provided on each of the plurality of circuit boards 5A to 5C as the second circuit board 5 such that the plurality of circuit boards 5A to 5C on which the solder bumps 4A to 4C are provided are coupled to the stacked circuit 3. In this case, the area of each of the plurality of second circuit boards 5A to 5C is smaller than that of the stacked circuit 3. It is to be noted that FIGS. 12A and 12B exemplify a case in which the stacked circuit 3 has such a structure as depicted in FIG. 3.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic apparatus, comprising:
    a first circuit board;
    a stacked circuit that is provided on the first circuit board through first coupling terminals and has a structure in which arithmetic elements and memory elements are stacked through inter-element coupling terminals and to which a signal is inputted from the first circuit board; and
    a second circuit board that is provided on the stacked circuit through second coupling terminals and to which a result of processing is outputted from the stacked circuit; wherein
    a number of the first coupling terminals and a number of the second coupling terminals are smaller than that of the inter-element coupling terminals.

2. The electronic apparatus according to claim 1, wherein
    the stacked circuit has a structure in which the arithmetic elements and the memory elements are stacked alternately; and
    a number of the inter-element coupling terminals positioned at the first circuit board side and the second circuit board side is smaller than that of the inter-element coupling terminals positioned at a central portion in a stacking direction.

3. The electronic apparatus according to claim 1, wherein
    the stacked circuit has a structure in which the arithmetic elements and the memory elements are stacked alternately; and
    a number of the inter-element coupling terminals positioned at the first circuit board side is smaller than that of the inter-element coupling terminals positioned at the second circuit board side.

4. The electronic apparatus according to claim 1, wherein
    the stacked circuit has a structure in which the arithmetic elements and the memory elements are stacked alternately; and
    a number of the inter-element coupling terminals positioned at the second circuit board side is smaller than that of the inter-element coupling terminals positioned at the first circuit board side.

5. The electronic apparatus according to claim 1, wherein the arithmetic element performs arithmetic operation based on a signal inputted from one side in the stacking direction and outputs a result of the arithmetic operation to the other side in the stacking direction.

6. The electronic apparatus according to claim 1, further comprising a structure body provided between the first circuit board and the second circuit board and including a through via.

7. The electronic apparatus according to claim 1, further comprising a plurality of circuit boards as the second circuit board.

8. An electronic part, comprising:
    a first circuit board;
    a stacked circuit that is provided on the first circuit board through first coupling terminals and has a structure in which arithmetic elements and memory elements are stacked through inter-element coupling terminals and to which a signal is inputted from the first circuit board; and
    a second circuit board that is provided on the stacked circuit through second coupling terminals and to which a result of processing is outputted from the stacked circuit; wherein a number of the first coupling terminals and a number of the second coupling terminals are smaller than that of the inter-element coupling terminals.

9. The electronic part according to claim 8, wherein
the stacked circuit has a structure in which the arithmetic elements and the memory elements are stacked alternately; and
a number of the inter-element coupling terminals positioned at the first circuit board side and the second circuit board side is smaller than that of the inter-element coupling terminals positioned at a central portion in a stacking direction.

10. The electronic part according to claim 8, wherein
the stacked circuit has a structure in which the arithmetic elements and the memory elements are stacked alternately; and
a number of the inter-element coupling terminals positioned at the first circuit board side is smaller than that of the inter-element coupling terminals positioned at the second circuit board side.

11. The electronic part according to claim 8, wherein
the stacked circuit has a structure in which the arithmetic elements and the memory elements are stacked alternately; and
a number of the inter-element coupling terminals positioned at the second circuit board side is smaller than that of the inter-element coupling terminals positioned at the first circuit board side.

12. The electronic part according to claim 8, wherein the arithmetic element performs arithmetic operation based on a signal inputted from one side in the stacking direction and outputs a result of the arithmetic operation to the other side in the stacking direction.

13. The electronic part according to claim 8, further comprising a structure body provided between the first circuit board and the second circuit board and including a through via.

14. The electronic part according to claim 8, further comprising a plurality of circuit boards as the second circuit board.

15. A fabrication method for an electronic apparatus, comprising:
    forming a stacked circuit in which arithmetic elements and memory elements are stacked through inter-element coupling terminals;
    providing the stacked circuit on a first circuit board that inputs a signal to the stacked circuit through a smaller number of first coupling terminals than that of the inter-element coupling terminals; and
    providing, on the stacked circuit, a second circuit board to which a result of processing is outputted from the stacked circuit through a smaller number of second coupling terminals than that of the inter-element coupling terminals.

16. The fabrication method for an electronic apparatus according to claim 15, wherein, at the forming the stacked circuit, the arithmetic elements and the memory elements are stacked alternately such that a number of the inter-element coupling terminals positioned at the first circuit board side and the second circuit board side is smaller than that of the inter-element coupling terminals positioned at a central portion in a stacking direction.

17. The fabrication method for an electronic apparatus according to claim 15, wherein, at the forming the stacked circuit, the arithmetic elements and the memory elements are stacked alternately such that a number of the inter-element coupling terminals positioned at the first circuit board side is smaller than that of the inter-element coupling terminals positioned at the second circuit board side.

18. The fabrication method for an electronic apparatus according to claim 15, wherein, at the forming the stacked circuit, the arithmetic elements and the memory elements are stacked alternately such that a number of the inter-element coupling terminals positioned at the second circuit board side is smaller than that of the inter-element coupling terminals positioned at the first circuit board side.

19. The fabrication method for an electronic apparatus according to claim 15, wherein,
    at the providing the stacked circuit, also a structure body including a through via is provided on the first circuit board; and
    at the providing the second circuit board, the second circuit board is provided on the stacked circuit and the structure body.

20. The fabrication method for an electronic apparatus according to claim 15, wherein, at the providing the second circuit board, a plurality of circuit boards are provided as the second circuit board.

* * * * *